United States Patent
Kim et al.

(10) Patent No.: US 11,512,254 B2
(45) Date of Patent: Nov. 29, 2022

(54) QUANTUM DOTS, AND AN ELECTRONIC DEVICE INCLUDING THE SAME

(71) Applicant: SAMSUNG ELECTRONICS CO., LTD., Suwon-si (KR)

(72) Inventors: Tae Hyung Kim, Seoul (KR); Yuho Won, Seoul (KR); Eun Joo Jang, Suwon-si (KR); Heejae Chung, Seoul (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 240 days.

(21) Appl. No.: 17/036,122

(22) Filed: Sep. 29, 2020

(65) Prior Publication Data
US 2021/0102119 A1 Apr. 8, 2021

(30) Foreign Application Priority Data
Oct. 7, 2019 (KR) .................. 10-2019-0123995

(51) Int. Cl.
*H01L 21/08* (2006.01)
*C09K 11/88* (2006.01)
(Continued)

(52) U.S. Cl.
CPC ........ *C09K 11/883* (2013.01); *C09K 11/0883* (2013.01); *H01L 51/502* (2013.01); *B82Y 20/00* (2013.01); *B82Y 40/00* (2013.01)

(58) Field of Classification Search
CPC . H01L 33/502; H01L 29/0665; H01L 51/502; C09K 11/025; C09K 11/0883; C09K 11/883
(Continued)

(56) References Cited

U.S. PATENT DOCUMENTS

| 7,615,289 B2 | 11/2009 | You et al. |
| 8,089,061 B2 | 1/2012 | Kobayashi et al. |

(Continued)

FOREIGN PATENT DOCUMENTS

| CN | 106479482 B | 11/2018 |
| CN | 109134550 A | 1/2019 |

(Continued)

OTHER PUBLICATIONS

Jaehoon Lim et al., "Influence of Shell Thickness on the Performance of Light-Emitting Devices Based on CdSe/Zn 1-X Cd X S Core/Shell Heterostructured Quantum Dots," Adbanced Materials, Nov. 10, 2014, pp. 8034-8040, vol. 26.

*Primary Examiner* — Brook Kebede
(74) *Attorney, Agent, or Firm* — Cantor Colburn LLP

(57) ABSTRACT

A quantum dot including a core including a first semiconductor nanocrystal including a Group III-V compound, and a shell disposed on the core and including a semiconductor nanocrystal including a Group II-VI compound, wherein the quantum dots do not include cadmium, the shell includes a first layer disposed directly on the core and including a second semiconductor nanocrystal including zinc and selenium, a second layer, the second layer being an outermost layer of the shell and including a third semiconductor nanocrystal including zinc and sulfur, and a third layer disposed between the first layer and the second layer and including a fourth semiconductor nanocrystal including zinc, selenium, and optionally sulfur, and a difference between a peak emission wavelength of a colloidal solution of the quantum dot and a peak emission wavelength of a film prepared from the colloidal solution is less than or equal to about 5 nanometers (nm).

20 Claims, 8 Drawing Sheets

(51) Int. Cl.
 *C09K 11/08* (2006.01)
 *H01L 51/50* (2006.01)
 *B82Y 40/00* (2011.01)
 *B82Y 20/00* (2011.01)

(58) Field of Classification Search
 USPC .......................................................... 257/40
 See application file for complete search history.

(56) References Cited

U.S. PATENT DOCUMENTS

| | | |
|---|---|---|
| 8,957,217 B2 | 2/2015 | Che et al. |
| 9,802,396 B2 | 10/2017 | Kim et al. |
| 2014/0166973 A1* | 6/2014 | Kurtin .................... C09K 11/08 |
| | | 438/46 |
| 2017/0250322 A1 | 8/2017 | Wang et al. |
| 2018/0059485 A1 | 3/2018 | Nam et al. |
| 2018/0175254 A1 | 6/2018 | Chung et al. |

FOREIGN PATENT DOCUMENTS

| | | |
|---|---|---|
| JP | 5729851 B2 | 6/2015 |
| KR | 20090020676 A | 2/2009 |
| KR | 1170168 B1 | 7/2012 |
| KR | 20150044018 A | 4/2015 |
| KR | 20180025388 A | 3/2018 |
| KR | 20180060923 A | 6/2018 |
| KR | 1880596 B1 | 7/2018 |
| KR | 20180113606 A | 10/2018 |
| KR | 1916904 B1 | 11/2018 |
| WO | WO-2019055809 A1 * | 3/2019 ........... C09K 11/025 |

\* cited by examiner

QUANTUM DOTS, AND AN ELECTRONIC DEVICE INCLUDING THE SAME

CROSS-REFERENCE TO RELATED APPLICATION

This application claims priority to and the benefit of Korean Patent Application No. 10-2019-0123995 filed in the Korean Intellectual Property Office on Oct. 7, 2019, and all the benefits accruing therefrom under 35 U.S.C. § 119, the entire content of which in its entirety is herein incorporated by reference.

BACKGROUND

1. Field

Quantum dots and an electronic device including the same are disclosed.

2. Description of the Related Art

Quantum dots (i.e., nano-sized semiconductor nanocrystals) may have different bandgap energies by controlling sizes and compositions of nanocrystals, unlike bulk materials. Quantum dots may exhibit electroluminescence and photoluminescence properties. In a wet chemical process, organic materials such as dispersing agents may be coordinated on, e.g., bound to, the surface of the semiconductor nanocrystal during a crystal growth to provide quantum dots having controlled sizes and photoluminescence properties. Photoluminescence properties of quantum dots may be applied in various fields. In terms of environmental views, developments for cadmium-free quantum dots capable of realizing, e.g., exhibiting, improved photoluminescence properties are desirable.

SUMMARY

An embodiment provides a cadmium-free quantum dot exhibiting high efficiency and long lifetime by inhibiting energy transfer between particles in a film, e.g., thin film, state.

An embodiment provides an electronic device including the cadmium-free quantum dot.

A Quantum dot according to an embodiment includes a core including a first semiconductor nanocrystal including a Group III-V compound and a shell disposed on the core, the shell including a semiconductor nanocrystal including a Group II-VI compound, wherein the quantum dot does not include cadmium, the shell includes a first layer disposed directly on the core, the first layer including a second semiconductor nanocrystal including zinc and selenium, a second layer, the second layer being an outermost layer of the shell, the second layer including a third semiconductor nanocrystal including zinc and sulfur, and a third layer disposed between the first layer and the second layer, the third layer including a fourth semiconductor nanocrystal including zinc, selenium, and optionally sulfur, and a difference between a peak emission wavelength of a colloidal solution of the quantum dot and a peak emission wavelength of a film prepared from the colloidal solution is less than or equal to about 5 nanometers (nm).

For example, a difference between a maximum peak emission wavelength of a colloidal solution of the quantum dot and a maximum peak emission wavelength of a film prepared from the colloidal solution may be less than or equal to about 4 nm.

A diameter of the quantum dot may be greater than or equal to about 9 nm and a ratio of a mole number of selenium to a mole number of sulfur in the quantum dot may be greater than or equal to about 4.5:1.

A sum of a thickness of the first layer of the shell and a thickness of the third layer of the shell may be greater than or equal to about 2.5 nm.

A diameter of the quantum dot may be greater than or equal to about 9.5 nm, and a ratio of a mole number of selenium to a mole number of sulfur in the quantum dot may be greater than or equal to about 4.6:1.

A sum of a thickness of the first layer of the shell and a thickness of a third layer of the shell may be greater than or equal to about 2.8 nm.

The fourth semiconductor nanocrystal may further include sulfur.

The third semiconductor nanocrystal may consist of zinc and sulfur.

A thickness of the second layer may be less than about 1 nm.

A thickness of the second layer may be less than about 0.5 nm.

The first semiconductor nanocrystal may include indium and phosphorus.

The first semiconductor nanocrystal may further include zinc.

A diameter of the core of the quantum dot may be about 2.5 nm to about 4 nm.

The diameter of the core of the quantum dot may be about 3 nm to about 3.5 nm.

The quantum dot may have a peak emission wavelength between 600 nm and about 670 nm and may emit red light.

A full width at half maximum (FWHM) of an emission peak of the quantum dot may be less than or equal to about 50 nm.

A quantum efficiency of the colloidal solution of the quantum dot may be greater than or equal to about 90% and a quantum efficiency of the film prepared from the solution may be greater than or equal to about 80%.

An electronic device according to an embodiment includes a first electrode and a second electrode facing each other; and a quantum dot light emitting layer disposed between the first electrode and the second electrode, the quantum dot light emitting layer including the quantum dot according to an embodiment.

The electronic device may include a charge auxiliary layer between the first electrode and the quantum dot light emitting layer, between the second electrode and the quantum dot light emitting layer, or a combination thereof.

In the electronic device, the first electrode may include an anode, a hole injection layer, a hole transport layer, an electron blocking layer, or a combination thereof may be disposed between the first electrode and the quantum dot light emitting layer, the second electrode may include a cathode, and an electron injection layer, an electron transport layer, a hole blocking layer, or a combination thereof may be disposed between the second electrode and the quantum dot light emitting layer.

The quantum dot according to an embodiment is a cadmium-free quantum dot and is eco-friendly, e.g., not environmentally harmful, because it does not include heavy metals such as lead, cadmium, or mercury. Energy transfer between particles may be suppressed, and a difference between wavelengths of the emission peak in a colloidal solution state and the emission peak of the film prepared from the solution may be less than or equal to about 5 nm, which is small. Therefore, the film including the quantum dot may achieve high efficiency and long lifetime similar to the solution state. Such a quantum dot is included in the light emitting layer of the electroluminescent device, and may be advantageously used in the production of electronic devices that exhibit high efficiency and long lifetime.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
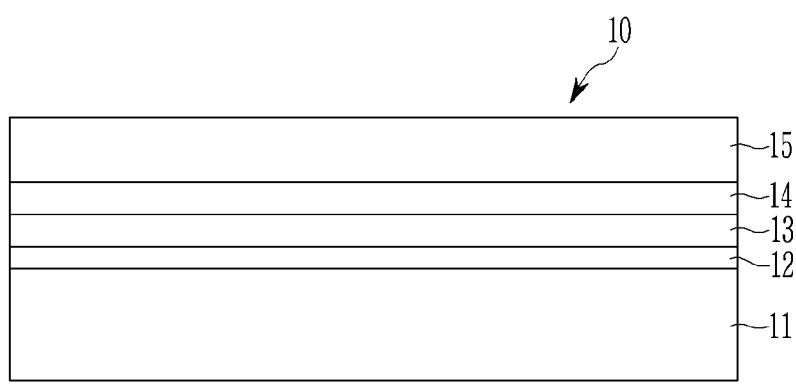
FIG. 1 is a schematic cross-sectional view of a quantum dot (QD) light emitting diode (LED) device according to a non-limiting embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function, or (highest occupied molecular orbital (HOMO) or lowest unoccupied molecular orbital (LUMO)) energy levels are expressed as an absolute value from a vacuum level. In addition, when the work function or energy levels are referred to be "deep," "high" or "large," the work function or energy levels have a large absolute value based on "0 eV" of the vacuum level, while when the work function or energy levels are referred to be "shallow," "low," or "small," the work function or energy levels have a small absolute value based on "0 eV" of the vacuum level.

As used herein, "Group" may refer to a group of Periodic Table.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, "metal" may include a semi-metal such as Si.

As used herein, "Group IV" may refer to Group IVA and Group IVB, and examples of a Group IV metal may be Si, Ge, and Sn, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" refers to replacement of hydrogen of a compound or a corresponding moiety by a substituent such as a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an aromatic group (e.g., a phenyl or a naphthyl group).

As used herein, when a definition is not otherwise provided, "hetero" refers to one including 1 to 3 heteroatoms of N, O, S, Si, P, or a combination thereof.

Quantum dots (hereinafter, also referred to as semiconductor nanocrystal particles) may absorb light from an excitation source and may emit energy corresponding to a bandgap energy of the quantum dots. Bandgap energies of quantum dots may be changed according to sizes, compositions, or a combination thereof of quantum dots. For example, as the sizes of quantum dots increase, bandgaps energy of the quantum dots may become more narrow and emission wavelengths of the quantum dots may increase. Semiconductor nanocrystals may be used as light emitting materials in various fields such as a display device, an energy device, or a bio light emitting device.

Cadmium-free quantum dots that do not include cadmium (or heavy metals such as lead or mercury) may have lower, e.g., inferior, electroluminescence properties and stability than quantum dots that include harmful heavy metals such as cadmium as the main element. However, harmful heavy metals such as cadmium may cause serious environmental and health problems and are regulated elements under the Restriction of Hazardous Substances Directive (RoHS) in many countries. Therefore, development of cadmium-free quantum dots having desired electroluminescence properties (desired emission wavelength, reduced full width at half maximum (FWHM), and improved external quantum efficiency, increased brightness, etc.) and an electronic device including the same is desired.

Cadmium-free semiconductor nanocrystals include semiconductor nanocrystals including a Group III-V compound, for example, quantum dots including a compound such as InP in a core and quantum dots including a Group II-VI compound such as a ZnSe compound in a core. However, the semiconductor nanocrystals including cadmium-free Group III-V compounds may have a problem of having a lower luminous efficiency than cadmium-based quantum dots, and furthermore, the quantum dots may have a problem of shifting an emission wavelength, a full width at half maximum (FWHM), or a combination thereof by the energy transfer among particles in a thin film obtained from a colloidal solution compared with a colloidal solution state, and thereby the efficiency may be further decreased. Accordingly, when an electronic device and the like including cadmium-free quantum dots as a light emitting layer is produced quantum dots having a small difference between an emission wavelength in a thin film state and an emission wavelength in a solution state by suppressing energy transfer among particles of quantum dots may be provided.

The present Inventors developed quantum dots including a core including Group III-V semiconductor nanocrystals and a shell disposed on the core and including Group II-VI semiconductor nanocrystals, wherein the quantum dots have no cadmium and have an emission wavelength difference of between the colloidal solution of quantum dots and the thin film obtained from the solution, for example, an peak emission wavelength difference of between the colloidal solution of quantum dots and the thin film obtained from the solution of less than or equal to about 5 nm. In the quantum dots, the shell includes a first layer disposed directly on the core and including a second semiconductor nanocrystal including zinc and selenium, a second layer disposed on the outermost of the shell and including a third semiconductor nanocrystal including zinc and sulfur and a third layer disposed between the first layer and the second layer and including a fourth semiconductor nanocrystal and including zinc, selenium, and optionally sulfur.

In an embodiment, in the quantum dots, a difference between a peak emission wavelength of a colloidal solution of the quantum dots and a peak emission wavelength of a thin film prepared from the solution may be less than or equal to about 4 nm, for example, less than or equal to about 3 nm, less than or equal to about 2.5 nm, less than or equal to about 2 nm, or less than or equal to about 1 nm. The quantum dots have no substantial difference in both peak emission wavelengths. An electronic device including a thin film including such quantum dots as a light emitting layer may increase luminous efficiency and light emission lifetime.

In the quantum dots according to the embodiment, an average diameter may be greater than or equal to about 9 nm, for example, greater than or equal to about 9.5 nm, greater than or equal to about 10 nm, greater than or equal to about 10.5 nm, or greater than or equal to about 11 nm and less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, or less than or equal to about 14 nm, but is not limited thereto. Herein, the diameter of the quantum dots may be an equivalent diameter calculated by assuming a spherical shape from a two-dimensional (2D) image of an electron microscope of the quantum dots. As used herein, a "diameter" may refer to an average diameter of a plurality of quantum dots.

In the quantum dots according to the embodiment, a ratio of the mole number, e.g., number of moles, of selenium to the mole number of sulfur may be greater than or equal to about 4.5:1, for example, greater than or equal to about 4.6:1, greater than or equal to about 4.7:1, greater than or equal to about 4.8:1, greater than or equal to about 4.9:1, greater than or equal to about 5.0:1, greater than or equal to about 5.1:1, greater than or equal to about 5.2:1, greater than or equal to about 5.3:1, greater than or equal to about 5.4:1, or greater than or equal to about 5.5:1 and the ratio may be less than or equal to about 20:1, for example, less than or equal to about 19:1, less than or equal to about 18:1, less than or equal to about 17:1, less than or equal to about 16:1, less than or equal to about 15:1, less than or equal to about 14:1, less than or equal to about 13:1, less than or equal to about 12:1, less than or equal to about 11:1, less than or equal to about 10:1, less than or equal to about 9:1, less than or equal to about 8:1, less than or equal to about 7:1, or less than or equal to about 6:1, but is not limited thereto.

When the average diameter of quantum dots and the ratio of the mole number of selenium relative to the mole number of sulfur in the quantum dots are within the disclosed ranges, the quantum dots may have excellent efficiency in both colloidal solutions and thin films, and the difference in emission wavelengths of such colloidal solutions and thin films may be small. For example, as the average diameter of the quantum dots and the ratio of the mole number of selenium relative to the mole number of sulfur in the quantum dot increases within the disclosed range, efficiency of the quantum dots increases, especially in the thin film, and accordingly, the difference in emission wavelengths in colloidal solution of the quantum dots and thin film may be further reduced. Therefore, when the quantum dot according to the embodiment is included in the light emitting layer of the electroluminescent device, etc., the efficiency and lifetime of the electroluminescent device including the same may be increased.

In addition, the quantum dots according to an embodiment, a sum of the thicknesses of the first and third layers of the shell may be greater than or equal to about 2.5 nm, greater than or equal to about 2.6 nm, greater than or equal to about 2.7 nm, greater than or equal to about 2.8 nm, greater than or equal to about 2.9 nm, greater than or equal to about 3.0 nm, greater than or equal to about 3.1 nm, greater than or equal to about 3.2 nm, greater than or equal to about 3.3 nm, greater than or equal to about 3.4 nm, greater than or equal to about 3.5 nm, greater than or equal to about 3.6 nm, greater than or equal to about 3.7 nm, greater than or equal to about 3.8 nm, greater than or equal to about 3.9 nm, greater than or equal to about 4.0 nm, greater than or equal to about 4.1 nm, greater than or equal to about 4.2 nm, greater than or equal to about 4.3 nm, greater than or equal to about 4.4 nm, or greater than or equal to about 4.5 nm and the sum of the thicknesses of the first and third layers may be, for example, less than or equal to about 20 nm, less than or equal to about 18 nm, less than or equal to about 17 nm, less than or equal to about 15 nm, less than or equal to about 13 nm, less than or equal to about 10 nm, less than or equal to about 8 nm, less than or equal to about 7 nm, less than or equal to about 6 nm, or less than or equal to about 5 nm, but is not limited thereto.

With an increase in the sum of the thicknesses of the first layer and the third layer in the shell, and with an increase in a quantum efficiency, for example, an efficiency in a thin film state, the emission wavelength difference between the colloidal solution of quantum dots and the thin film may be decreased. While not wanting to be bound by theory, it is understand that in the quantum dots according to an embodiment, by controlling a sum of thicknesses of a first layer of the shell disposed directly on the core and a third layer present between the first layer of the shell and a second layer which is the outermost layer of the shell, that is a thickness of an intermediate layer of the shell except for the thicknesses of the outermost layer of the shell and the core, to be in the disclosed range, energy transfer among quantum dot particles is effectively suppressed as the distance among, e.g., between, cores of the quantum dots is relatively far apart compared with the case of having a thin thickness of the intermediate layer of the shell even when the quantum dots are closer to other quantum dots in a thin film state compared with a solution state. Thus quantum dots including core and shell according to an embodiment may have an average diameter greater than the predetermined size, and the sum of the thicknesses of the first layer disposed directly on the core and the third layer present between the first layer and the outermost layer (second layer) of the shell, which is the intermediate layer of the shell except for the core and the outermost layer of the shell, is greater than or equal to the predetermined size.

The intermediate layer of the shell, which is the first layer and the third layer, may include semiconductor nanocrystals including zinc and selenium, and may further include sulfur. The quantum dots according to an embodiment have a ratio of a mole number of selenium to a mole number of sulfur in quantum dots within the range, for example, greater than or equal to about 4.5:1, which means that the mole number of selenium is significantly higher than the mole number of sulfur in the quantum dots. The semiconductor nanocrystals including zinc and sulfur have a much higher bandgap energy than the semiconductor nanocrystals including zinc and selenium. As the second layer of the shell, which is the outermost layer of quantum dots according to an embodiment, includes zinc and sulfur, an energy offset between the core and the shell of quantum dots may be further increased, and quantum dots with a high luminous efficiency and more stable structure may be provided. Accordingly, the outermost layer may include semiconductor nanocrystals including zinc and sulfur, and the outermost layer may not include selenium. The outermost layer of the shell including the semiconductor nanocrystals including zinc and sulfur may have a high bandgap energy, it may be difficult to transfer charge or hole into quantum dots, and a luminous efficiency of the electroluminescent device may be deteriorated. Accordingly, the outermost layer including zinc and sulfur may be formed in a thickness as thin as possible, for example, less than about 1 nm, less than or equal to about 0.8 nm, less than or equal to about 0.7 nm, less than or equal to about 0.5 nm, less than or equal to about 0.4 nm, or less than or equal to about 0.3 nm. The thickness may correspond to a thickness of 1 monolayer of the semiconductor nanocrystals including zinc and sulfur. As used herein, "1 monolayer" refers to a state in which the semiconductor nanocrystals including zinc and sulfur form a layer in one molecular thickness, e.g., a thickness of one molecule.

The core of quantum dots according to an embodiment may include a first semiconductor nanocrystal including a Group III-V compound, and the first semiconductor nanocrystal may include indium and phosphorus. As described herein, cadmium-free quantum dots may include indium and phosphorus. For example, as quantum dots including semiconductor nanocrystals including indium and phosphorus in a core and including semiconductor nanocrystals including a Group II-VI compound, for example, zinc and selenium, zinc and sulfur, or zinc, selenium, and sulfur in a shell may emit red light or green light.

In an embodiment, the core of the quantum dots may include semiconductor nanocrystals including indium and phosphorus, and the shell may include a first layer and a third layer including semiconductor nanocrystals including zinc and selenium and selectively, sulfur and a second layer, which is the outermost layer, including semiconductor nanocrystals including zinc and sulfur. The quantum dot may be a quantum dot configured to emit red light.

According to an embodiment, the core of quantum dots may include semiconductor nanocrystals including indium and phosphorus and selectively zinc, and the shell may include a first layer and a third layer including semiconductor nanocrystals including zinc, selenium, and selectively sulfur and a second layer including semiconductor nanocrystals including zinc and sulfur. The quantum dot may be a quantum dot configured to emit green light.

The third layer of the shell may include at least two layers, wherein the at least two layers may include semiconductor nanocrystals having a same composition as each other or may include semiconductor nanocrystals having different compositions from each other. According to an embodiment, the semiconductor nanocrystal compositions of layers for the first layer and the third layer may be different from each other, for example, the layers may have a concentration gradient in which a mole ratio of selenium to sulfur gradually increases in a direction toward the core of the quantum dot, but a mole ratio of sulfur to selenium gradually increases in a direction toward the outermost layer of the shell from the core. In an embodiment, semiconductor nanocrystals for the first layer and the third layer include, e.g., consist of, zinc and selenium, and the second layer may include semiconductor nanocrystals including, e.g., consisting of, zinc and sulfur. In this case, the semiconductor nanocrystal compositions for the first layer and the third layer including, e.g., consisting of, zinc and selenium may be the same as or different from each other.

In an embodiment, the quantum dots may be quantum dots emitting red light and having a peak emission wavelength between about 600 nm to about 670 nm. For example, the quantum dots may have a peak emission wavelength between about 610 nm to about 650 nm, for example, a peak emission wavelength between about 620 nm to about 640 nm.

A full width at half maximum (FWHM) of the emission peak of the quantum dots according to an embodiment may be less than or equal to about 50 nm. For example, the full width at half maximum (FWHM) of the emission peak of the quantum dots according to an embodiment may be less than or equal to about 45 nm, less than or equal to about 40 nm, less than or equal to about 37 nm, less than or equal to about 36 nm, less than or equal to about 35 nm, or less than or equal to about 30 nm. Quantum dots according to an embodiment may have the a full width at half maximum (FWHM) of the emission peak within the disclosed range in both a state of a solution and a thin film, and excellent optical properties may be provided.

In the quantum dots, a quantum efficiency of a colloidal solution may be greater than or equal to about 90%, and the quantum efficiency of a thin film obtained from the solution may be greater than or equal to about 80%. As the average diameter of the quantum dots is increased from the aforementioned range, a sum of the thicknesses of the first layer and the third layer for the shell is increased, and emission quantum efficiency in a solution state may be increased to about 99%, and the luminous efficiency in a thin film state may be also increased to about 93%. In this case, the emission peak difference between the solution state and the thin film state may be less than or equal to about 3 nm, for example, less than or equal to about 2 nm, or less than or equal to about 1 nm, and substantially, the emission peak difference is about 0. Thus an electronic device including the quantum dots according to an embodiment in a light emitting layer may further enhance luminous efficiency and lifetime.

A shape of the quantum dot is not particularly limited, may, for example, be a spherical, polyhedron, pyramid, multipod, or cube shape, nanotube, nanowire, nanofiber, nanosheet, or a combination thereof, but is not limited thereto.

The quantum dot may include the organic ligand, the organic solvent, or a combination thereof, which will be described herein, on a surface of the quantum dot. The organic ligand, and/or the organic solvent, or the combination thereof, may be bound to the surface of the quantum dot.

The cadmium-free quantum dots according to an embodiment may be easily synthesized using a variety of methods of producing quantum dots, for example, using a method of producing quantum dots including a core and a shell. For example, the method of synthesizing quantum dots according to an embodiment may include: preparing a core including a first semiconductor nanocrystal including a Group III-V compound; reacting the core with precursors for forming a second semiconductor nanocrystal in an appropriate solvent to provide a first layer of the shell including the second semiconductor nanocrystals including zinc and selenium and optionally sulfur directly on the core; introducing precursors of a fourth semiconductor nanocrystal including zinc and selenium and optionally sulfur on the particle formed with the first layer of the shell including the second semiconductor nanocrystals on the core including the first semiconductor nanocrystal obtained from the reaction and further reacting the same to provide a third layer which is an additional layer of the fourth semiconductor nanocrystals between the first layer and a second layer which is the outermost layer; and lastly, injecting precursors of a third semiconductor nanocrystal including zinc and sulfur on the semiconductor nanocrystal particle formed with the shell of the first layer and the third layer, e.g., adding precursors of a third semiconductor nanocrystal including zinc and sulfur to the semiconductor nanocrystal particle formed with the shell of the first layer and the third layer, and reacting the same to provide an outermost layer of the shell.

Herein, the core of the first semiconductor nanocrystal including the Group III-V compound may be obtained by, for example, reacting a precursor of Group III compound with a precursor of Group V compound to synthesize Group III-V semiconductor nanocrystals, or may be obtained from a commercially available Group III-V semiconductor nanocrystal core. For example, the Group III-V semiconductor nanocrystal core may be a core of first semiconductor nanocrystals including indium and phosphorus, wherein the core may be obtained by injecting an indium precursor and a phosphorus precursor into an organic solvent heated at a reaction temperature, e.g., adding an indium precursor and a phosphorus precursor to an organic solvent heated to a reaction temperature, and reacting the same under a presence of an organic ligand, surfactant, or a combination thereof. In an embodiment, the core may be obtained by a hot injection, e.g., addition, in which phosphorus precursors and, optionally, together with zinc precursors are together injected at a state that the solution including metal precursors such as indium precursors and ligand, if requested, is heated at, e.g., to, a high temperature (e.g., temperature of greater than or equal to about 200° C.).

When the semiconductor nanocrystal core including indium and phosphorus is prepared by the reaction, the reaction is quenched by cooling the temperature, and the core of semiconductor nanocrystals is precipitated by adding an excessive amount of nonsolvent and cleaned and filtered.

Subsequently, a method of forming a shell on the surface of the obtained semiconductor nanocrystal core includes: injecting precursors of the semiconductor nanocrystals for forming the shell into a solvent including the obtained core while heating the same, e.g., adding precursors of the semiconductor nanocrystals for forming the shell to a solvent including the obtained core while heating the same, and reacting the same; or previously injecting the solvent and the zinc precursors into a separate reactor, e.g., previously adding the solvent and the zinc precursors to a separate reactor, and reacting the same, adding the obtained core of semiconductor nanocrystals and an additional compound for forming the shell, for example, precursors of selenium and reacting the same, so that precursors of the second semiconductor nanocrystal including zinc and selenium and optionally, sulfur are added into the core of the first semiconductor nanocrystals including indium and phosphorus and reacted. Thereafter, a method of forming the additional layers for the shell is the same as described herein.

For example, the zinc precursor may be a Zn metal powder, an alkylated Zn compound, a Zn alkoxide, a Zn carboxylate, Zn nitrate, Zn chlorate, Zn sulfate, Zn acetylacetonate, a Zn halide, Zn cyanide, Zn hydroxide, Zn oxide, Zn peroxide, or a combination thereof. For example, examples of the zinc precursor may be dimethylzinc, diethylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. Two or more different zinc precursors may be used.

The type of the selenium precursor is not particularly limited and may be appropriately selected. For example, the selenium precursor may be selenium, selenium-trioctylphosphine (Se-TOP), selenium-tributylphosphine (Se-TBP), selenium-triphenylphosphine (Se-TPP), tellurium-tributylphosphine (Te-TBP), or a combination thereof but is not limited thereto.

The types of the sulfur precursor are not particularly limited and may be appropriately selected. The sulfur precursor may include a sulfur powder, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof.

The organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, R$_2$POOH (wherein, R and R' are independently a C1 to C24 aliphatic hydrocarbon (e.g., a C1 to C24 alkyl group, a C2 to C24 alkenyl group, a C2 to C24 alkynyl group), or a C6 to C20 aromatic hydrocarbon (e.g., a C6 to C20 aryl group)), or a combination thereof.

The organic ligand may coordinate, e.g., be bound to, the surface of the obtained nanocrystal and may assist with dispersion of the nanocrystal in the solution, have an effect on light emitting and electrical characteristics of quantum dots, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, a triphenyl phosphine compound, or an oxide compound thereof; phosphonic acid and the like, but are not limited thereto. Two or more different organic ligands may be used.

The solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. The type and the content of the solvent may be appropriately selected taking into consideration types and amounts of the used precursors and organic ligands.

The reaction may include preparing a mixture by appropriately adding, for example, precursors of the semiconductor nanocrystals, the organic ligands, or a combination thereof; injecting, for example, precursors of the semiconductor nanocrystals, the organic ligands, or a combination thereof; or a combination thereof for forming a core of the semiconductor nanocrystal, a first layer of the shell, a third layer of the shell, and a second layer of the shell into solvents, respectively, in each step, and, optionally, heating the mixture at a predetermined temperature, for example, greater than or equal to about 100° C., greater than or equal to about 110° C., greater than or equal to about 120° C., greater than or equal to about 150° C., greater than or equal to about 200° C., greater than or equal to about 250° C., greater than or equal to about 270° C., or greater than or equal to about 280° C., for example, under vacuum, inert atmosphere, or a combination thereof. After heating the same at the predetermined temperature, the mixture may be, optionally, cooled, for example, after preparing an additional reactant, for example, a first layer shell and before adding precursors for preparing a third layer shell thereto. The cooling temperature may be, for example, less than or equal to about 150° C., less than or equal to about 130° C., or less than or equal to about 100° C. Cooling the reactant or the reaction products in the previous step again before adding the additional reactant may prevent the third layer shell of the semiconductor nanocrystal from being non-uniformly formed by adding the additional reactants at an increased temperature and drastically reacting the additional reactants, at a state in which the product which has formed in the previous step, for example, the first layer shell of the semiconductor nanocrystal formed on the semiconductor nanocrystal core is formed.

In an embodiment, in order to provide the first layer of the nanocrystal shell on the semiconductor nanocrystal core, a first mixture of mixing precursors for forming the semiconductor nanocrystal core and the first layer of the semiconductor nanocrystal shell is heated at, e.g., to, an appropriate reaction temperature, for example, at a first reaction temperature. In this case, the first reaction temperature may be, for example, greater than or equal to about 250° C., greater than or equal to about 260° C., greater than or equal to about 270° C., or greater than or equal to about 280° C., but is not limited thereto. The processes of forming a third layer of the semiconductor nanocrystal shell and forming a second shell, which is the outermost layer of the shell, on the semiconductor nanocrystal formed with the first layer shell are also the same as or similar to the aforementioned process.

After the completion of the reaction, when the nonsolvent is added to the reaction product, the nanocrystalline particles coordinated with the ligand compound may be separated. The nonsolvent may be a polar solvent that is miscible with the solvent used in the core formation reaction, shell formation reaction, or a combination hereof and may not be capable of dispersing the produced nanocrystals therein. The nonsolvent may be selected depending on the solvent used in the reaction and may be, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The separation may use centrifugation, precipitation, chromatography, or distillation. The separated nanocrystals may be washed by adding the separated nanocrystals to a washing solvent as desired. The washing solvent is not particularly limited, and a solvent having a solubility parameter similar to the ligand may be used. Examples thereof may include hexane, heptane, octane, chloroform, toluene, and benzene.

The quantum dots of an embodiment may be non-dispersible or non-water soluble for water, the aforementioned nonsolvent, or a combination thereof.

The quantum dots of an embodiment may be dispersed in the aforementioned organic solvent. In an embodiment, the aforementioned quantum dots may be dispersed in a C6 to C40 aliphatic hydrocarbon, a C6 to C40 substituted or unsubstituted aromatic hydrocarbon, or a combination thereof.

In an embodiment, an electronic device includes the aforementioned semiconductor nanocrystal particles. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescence element (e.g., a lighting such as a quantum dot sheet or a quantum dot rail or a liquid crystal display (LCD)) or an electroluminescent device (e.g., QD LED).

In another non-limiting embodiment, the electronic device may include a quantum dot sheet and the aforementioned semiconductor nanocrystal particle may be included in the quantum dot sheet (e.g., in a form of a semiconductor nanocrystal-polymer composite).

In a non-limiting embodiment, the electronic device may be an electroluminescent device. Referring to FIG. 1, the electroluminescent device 10 according to an embodiment includes a first electrode 11 and a second electrode 15 facing each other and a light emitting layer 13 disposed between the first electrode 11 and the second electrode 15 and including a plurality of quantum dots. A hole auxiliary layer 12 may be provided between the first electrode 11 and the light emitting layer 13. An electronic auxiliary layer 14 may be provided between the second electrode 15 and the light emitting layer 13.

The light emitting device may further include a substrate (not shown). The substrate may be disposed at the side of the first electrode 11 or the second electrode 15. In an embodiment, the substrate may be disposed at the side of the first electrode. The substrate may be a substrate including an insulation material (e.g., an insulating transparent substrate). The substrate may include glass; various polymers such as a polyester (e.g., a polyethyleneterephthalate (PET), a polyethylenenaphthalate (PEN)), a polycarbonate, a polyacrylate, a polyimide, or a polyamideimide; a polysiloxane (e.g., polydimethylsiloxane (PDMS)); an inorganic material such as $Al_2O_3$ or ZnO; or a combination thereof, but is not limited thereto. The substrate may be made of a silicon wafer, and the like. Herein, "transparent" refers to transmittance for light in a predetermined wavelength (e.g., light emitted from the quantum dots) of greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like, but is not particularly limited. The transparent substrate may have flexibility. The substrate may be omitted.

One of the first electrode 11 or the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal such as nickel, platinum, vanadium, chromium, copper, zinc, and gold or an alloy thereof; a conductive metal oxide such as zinc oxide, indium oxide, tin oxide, indium tin oxide (ITO), indium zinc oxide (IZO), or fluorine doped tin oxide; or a combination of a metal and an oxide such as ZnO and Al or $SnO_2$ and Sb, but is not limited thereto. In an embodiment, the first electrode may include a transparent conductive metal oxide, for example, indium tin oxide. A work function of the first electrode may be higher, e.g., greater, than a work function of the second electrode as described herein. A work function of the first electrode may be lower, e.g., less, than a work function of the second electrode as described herein.

The second electrode 15 may be made of a conductor, for example, a metal, a conductive metal oxide, a conductive polymer, or a combination thereof. The second electrode 15 may be, for example, made of a metal such as aluminum, magnesium, calcium, sodium, potassium, titanium, indium, yttrium, lithium, gadolinium silver, gold, platinum, tin, lead, cesium, or barium, or an alloy thereof; a multi-layered structure material such as LiF/Al, lithium oxide ($Li_2O$)/Al, Liq/Al, LiF/Ca, and $BaF_2$/Ca, but is not limited thereto. The conductive metal oxide is the same as described herein.

In an embodiment, the work function of the first electrode 11 and the second electrode is not particularly limited, and may be appropriately selected. A work function of the first electrode may be higher, e.g., greater, than a work function of the second electrode. The work function of the first electrode may be lower, e.g., less, than the work function of the second electrode.

The first electrode 11, the second electrode 15, or a combination thereof may be a light-transmitting electrode, and the light-transmitting electrode may be, for example, made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 or the second electrode 15 is a non-light-transmitting electrode, the non-light-transmitting electrode may be made of, for example, an opaque conductor such as aluminum (Al), silver (Ag), or gold (Au).

The thickness of the electrode (first electrode, second electrode, or combination thereof) is not particularly limited, and may be appropriately selected in consideration of device efficiency. For example, the thickness of the electrodes may be greater than or equal to about 5 nm, or greater than or equal to about 50 nm. For example, the thickness of the electrodes may be less than or equal to about 100 micrometers (μm), less than or equal to about 10μm, less than or equal to about 1μm, less than or equal to about 900 nm, less than or equal to about 500 nm, or less than or equal to about 100 nm.

The light emitting layer 13 includes (e.g., a plurality of) quantum dots. The plurality of quantum dots may include the aforementioned quantum dots according to an embodiment. In an embodiment, the light emitting layer 13 may include a monolayer of quantum dots. In an embodiment, the light emitting layer 13 includes one or more, 2 or more, 3 or more, or 4 or more and 20 or less, 10 or less, 9 or less, 8 or less, 7 or less, or 6 or less monolayers of quantum dots. The light emitting layer 13 may have a thickness of greater than or equal to about 5 nm, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 13 may have, for example, a thickness of about 10 nm to about 150 nm, for example, about 10 nm to about 100 nm, or about 10 nm to about 50 nm. As used herein, a "thin film" may have a thickness of greater than or equal to about 5 nm, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm, for example, about 10 nm to about 150 nm, about 10 nm to about 100 nm, or about 10 nm to about 50 nm.

The light emitting device according to the embodiment may further include a hole auxiliary layer. The hole auxiliary layer 12 may be disposed between the first electrode 11 and the light emitting layer 13. The hole auxiliary layer 12 may include a hole injection layer, a hole transport layer, an electron (or hole) blocking layer, or a combination thereof. The hole auxiliary layer 12 may be a single-component layer or a multilayer structure in which adjacent layers include different components.

The HOMO energy level of the hole auxiliary layer 12 has a HOMO energy level that may be matched with the HOMO energy level of the light emitting layer 13 in order to enhance mobility of holes transferred from the hole auxiliary layer 12 to the light emitting layer 13. In an embodiment, the hole auxiliary layer 12 may include a hole injection layer disposed close to the first electrode 11 and a hole transport layer disposed close to the light emitting layer 13.

Materials included in the hole auxiliary layer 12 (e.g., a hole transport layer or a hole injection layer) are not particularly limited, but may, for example, include poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino] biphenyl (α-NPD), 4,4',4"-tris[phenyl(m-toly)amino] triphenylamine (m-MTDATA), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbon-based material such as graphene oxide, or a combination thereof, but are not limited thereto.

The electron blocking layer (EBL) may include, for example, poly(3,4-ethylenedioxythiophene):poly(styrene-sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N, N, N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, less than or equal to about 40 nm, less than or equal to about 35 nm, or less than or equal to about 30 nm, but is not limited thereto.

The electronic auxiliary layer 14 may be disposed between the light emitting layer 13 and the second electrode 15. The electron auxiliary layer 14 may include, for example, an electron injection layer, an electron transport layer, a hole (or electron) blocking layer, or a combination thereof. The electron auxiliary layer may be, for example, an electron injection layer (EIL) that facilitates electron injection, an electron transport layer (ETL) that facilitates electron transport, or a hole blocking layer (HBL) that blocks hole movement, or a combination thereof. For example, an electron injection layer may be disposed between the electron transport layer and the cathode. For example, the hole blocking layer may be disposed between the light emitting layer and the electron transport (injection) layer, but is not limited thereto. The thickness of each layer may be appropriately selected. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles, or may be an organic layer formed by vapor deposition.

The electron transport layer (ETL) may include, for example, 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato)gallium ($Gaq_3$), tris(8-hydroxyquinolinato)indium ($Inq_3$), tris(8-hydroxyquinolinato)zinc ($Znq_2$), Bis(2-(2-hydroxyphenyl)benzothiazolate) zinc (II) ($Zn(BTZ)_2$), tris(8-hydroxyquinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

The electron auxiliary layer 14 may include an electron transport layer. The electron transport layer may include a plurality of nanoparticles. The nanoparticles may include a metal oxide including zinc. The metal oxide may include zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof and $0 \geq x \geq 0.5$). In an embodiment, M in the chemical formula may be magnesium (Mg). In an embodiment, in the chemical formula, x may be greater than or equal to about 0.01 and less than or equal to about 0.3, less than or equal to about 0.25, less than or equal to about 0.2, or less than or equal to about 0.15. An absolute value of LUMO of the aforementioned quantum dots included in the light emitting layer may be smaller than an absolute value of LUMO of the metal oxide. An average size of the nanoparticles may be greater than or equal to about 1 nm, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not be rod-shaped. The nanoparticles may not be in the form of nanowires.

In an embodiment, each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
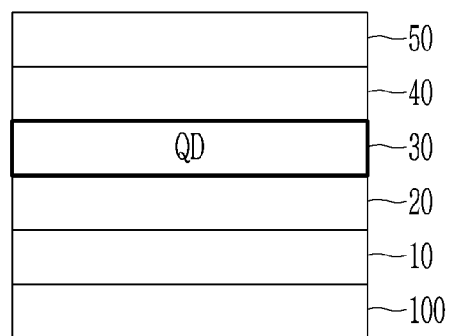
FIG. 2 is a schematic cross-sectional view of a QD LED device according to another non-limiting embodiment.

Referring to FIG. 2, a device according to an embodiment may have a normal structure. In an embodiment, in the device 30, an anode 10 disposed on a transparent substrate 100 may include a metal oxide-based transparent electrode (e.g., ITO electrode) and a cathode 50 facing the anode 10 may include a conductive metal (e.g., Mg, Al Ag, or a combination thereof) (e.g., having a relatively low work function). A hole auxiliary layer 20 (e.g., a hole injection layer of, e.g., including, for example, PEDOT:PSS, a p-type metal oxide, or a combination thereof; a hole transport layer of, e.g., including, TFB, poly(N-vinylcarbazole) (PVK), or a combination thereof; or a combination thereof) may be disposed between the transparent electrode 10 and the light emitting layer 30. The hole injection layer may be near to the transparent electrode and the hole transport layer may be near to the light emitting layer. An electron auxiliary layer 40 such as an electron injection layer/transport layer may be disposed between the quantum dot light emitting layer 30 and the cathode 50.

Figure 3:
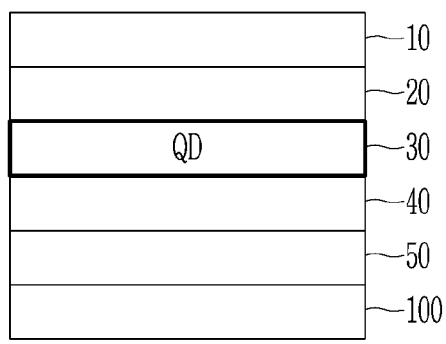
FIG. 3 is a schematic cross-sectional view of a QD LED device according to another non-limiting embodiment.

Referring to FIG. 3, a device according to an embodiment may have an inverted structure. A cathode 50 disposed on the transparent substrate 100 may include a metal oxide-based transparent electrode (e.g., ITO) and an anode 10 facing the cathode may include a metal (Au, Ag, Mg, etc.) (e.g., having a relatively high work function). For example, an (optionally doped) n-type metal oxide (e.g., crystalline Zn metal oxide) may be disposed between the transparent electrode 50 and the light emitting layer 30 as an electron auxiliary layer (e.g., electron transport layer) 40. $MoO_3$ or an other p-type metal oxide may be disposed between the metal anode 10 and the quantum dot light emitting layer 30 as a hole auxiliary layer (e.g., a hole transport layer including TFB; a hole injection layer including PVK, $MoO_3$, or a combination thereof or an other p-type metal oxide; or a combination thereof) 20.

The aforementioned device may be produced by an appropriate method. For example, the electroluminescent device may be produced by forming a hole auxiliary layer (e.g., by vapor deposition or coating) on a substrate on which an electrode is formed, forming a light emitting layer including quantum dots (e.g., a pattern of the aforementioned quantum dots), forming (an electron auxiliary layer as desired and) an electrode (e.g., by vapor deposition or coating) on the light emitting layer. The method for forming the electrode/hole auxiliary layer/electron auxiliary layer may be appropriately selected and is not particularly limited.

The devices of the embodiments may have a maximum external quantum efficiency (EQE) of greater than or equal to about 7%, greater than or equal to about 8%, or greater than or equal to about 10%. The devices of the embodiments may have a T50 of greater than or equal to about 50 hours, for example, greater than or equal to about 60 hours, greater than or equal to about 70 hours, greater than or equal to about 80 hours, greater than or equal to about 90 hours, greater than or equal to about 100 hours, greater than or equal to about 120 hours, greater than or equal to about 130 hours, greater than or equal to about 140 hours, greater than or equal to about 150 hours, or greater than or equal to about 160 hours. The devices of the embodiments may emit red light or green light. In an embodiment, the device may emit red light. The red light may have a maximum peak emission wavelength of greater than or equal to about 600 nm, greater than or equal to about 610 nm, greater than or equal to about 620 nm, or greater than or equal to about 630 nm, and less than or equal to about 690 nm, less than or equal to about 680 nm, less than or equal to about 670 nm, or less than or equal to about 660 nm. A full width at half maximum (FWHM) of the emission peak of the red light may be less than or equal to about 50 nm, less than or equal to about 45 nm, less than or equal to about 40 nm, less than or equal to about 38 nm, less than or equal to about 37 nm, less than or equal to about 36 nm, or less than or equal to about 35 nm.

Hereinafter, specific embodiments are presented. However, the examples described below are only for specifically illustrating or explaining the invention, and thus the scope of the invention should not be limited.

EXAMPLES

1. Photoluminescence Analysis

Photoluminescence (PL) spectra of the prepared quantum dots are obtained at room temperature using an irradiation wavelength of 372 nanometers (nm), by using a Hitachi F-7000 spectrometer.

2. Absolute Quantum Efficiency (Quantum Yield (QY)) of Quantum Dot (QD)

Quantum efficiency is obtained by dividing the number of photons emitted along with photoluminescence from a sample by the number of photons absorbed by the sample. Quantum dot dispersion or a thin film prepared from the dispersion is measured for quantum efficiency using HAMAMATSU-Quantaurus-QY, C11347 (manufacturer: Hamamatsu Corporation).

3. Inductively Coupled Plasma Atomic Emission Spectroscopy (ICP-AES)

Inductively coupled plasma atomic emission spectroscopy (ICP-AES) is performed using Shimadzu ICPS-8100.

4. Electroluminescence Spectroscopy

The electroluminescence properties are evaluated using a Keithley 2200 source measuring instrument and a Minolta CS2000 spectroradiometer (current-voltage-brightness measuring instrument). The current, brightness, and electroluminescence (EL) according to the voltage applied to the device are measured through a current-voltage-brightness measuring equipment, from which external quantum efficiency is calculated.

5. Lifetime Characteristics

T50 (hours (h)): When driving the device at 1,000 cdm$^{-2}$, a time (h) at which it takes to achieve 50% brightness compared with 100% initial brightness.

T90 (h): When driving the device at 1,000 cdm$^{-2}$, a time (h) at which it takes to achieve 90% brightness compared with 100% initial brightness.

Synthesis is performed in an inert gas atmosphere (e.g., under nitrogen flowing conditions) unless otherwise specified.

Synthesis Example 1: Preparation of InP Core

In 250 milliliter (mL) reaction flask, 4 millimoles (mmole) of indium acetate and 12 mmole of palmitic acid are dissolved in 1-octadecene and heated at 120° C. under vacuum. Inside of the reactor is substituted with nitrogen. After heating at 280° C., a mixed solution of 2 mmole of tris(trimethylsilyl)phosphine (TMS3P) and 1 ml of trioctylphosphine is rapidly injected thereto and reacted for 30 minutes. Acetone is added to the reaction solution which has rapidly cooled at a room temperature, and centrifuged to provide a precipitate, and the precipitate is dispersed in toluene again. The obtained InP semiconductor nanocrystal is performed with ultraviolet (UV) spectroscopic photometer, so from the results, it is confirmed that a diameter of the InP core is about 3.3 nm.

EXAMPLES AND COMPARATIVE EXAMPLES

Comparative Example 1: Synthesis of InP/ZnSe/ZnS Quantum Dots and Analysis of Characteristics (1) Se powder and S powder are each dissolved in trioctylphosphine (TOP) to prepare a 2 molar (moles per liter (M)) Se/TOP stock solution and a 1 M S/TOP stock solution.

(2) Zinc acetate and oleic acid are dissolved into trioctylamine in 200 mL reaction flask and vacuumed at 120° C. for 10 minutes. After substituting the inside of the reaction flask with nitrogen (N$_2$), the toluene solution of the InP core synthesized from Synthesis Example 1 is injected while the obtained solution is heated at a temperature of 340° C., and the obtained Se/TOP stock solution is repeatedly injected for several times. By performing the reaction, a reaction solution including particles in which ZnSe shell is disposed on a core is obtained. The total reaction time is about 100 minutes, and the total amount of the used Se with respect to 1 mole of indium is about 23 moles.

Subsequently, a S/TOP stock solution is injected to the reaction solution at the reaction temperature. By performing the reaction, a reaction solution including particles in which a ZnS shell is disposed on the ZnSe shell. The total reaction time is 60 minutes, and the total amount of the used S with respect to 1 mole of indium is about 13 moles. Then the solution is cooled at a room temperature and added with an excessive amount of ethanol and then centrifuged to discharge a supernatant, and a precipitate is dried and dispersed in toluene to provide a InP/ZnSe/ZnS quantum dot solution.

(3) The results of performing a photoluminescence analysis of the obtained quantum dot dispersion show that a photoluminescence peak is 631 nm, a full width at half maximum (FWHM) is 36 nm, and a quantum efficiency is 98%.

(4) In addition, the quantum dots are performed, e.g., studied, with a transmission electron microscopy (TEM) analysis, and it is confirmed that the ZnSe shell formed directly on the core of the quantum dots has a thickness of about 1.9 nm; the ZnS shell, the outermost layer, formed on the ZnSe shell has a thickness of about 0.3 nm; and the obtained quantum dots have a diameter of about 7.7 nm. In addition, from the results of performing ICP-AES analysis, it is understood that a ratio of the mole number of the entire selenium to the mole number of the entire sulfur in the quantum dots is about 2.82:1.

(5) Lastly, the dispersion of the quantum dots is coated on a glass substrate in a thickness of 25 nm and then heated at 80° C. to provide a thin film. The obtained thin film is performed, e.g., studied, with a photoluminescence analysis as in (3), and the results show that a light emission peak of the thin film is 639 nm, a full width at half maximum (FWHM) is 38 nm, and a quantum efficiency is 69%.

Figure 4:
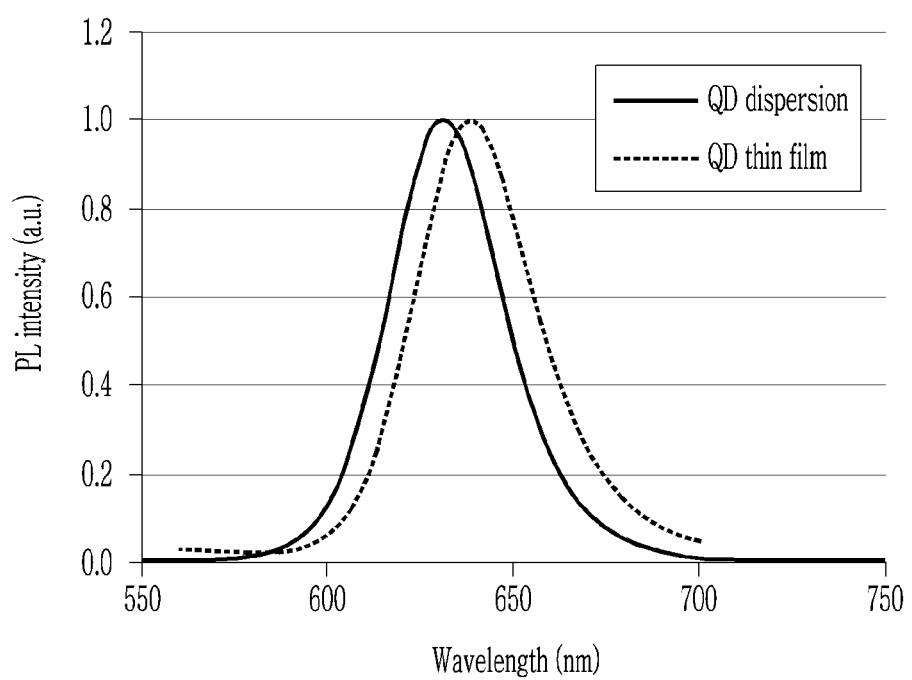
FIG. 4 is a graph of photoluminescence (PL) (arbitrary units (a.u.)) versus wavelength (nm) showing luminescence analysis results of the colloidal solution of the quantum dots (QD dispersion) prepared in Comparative Example 1 and the thin film prepared therefrom.

Table 1 shows the results of analyzing the photoluminescence (PL) of the thin film and the quantum dot dispersion and a difference of peak emission wavelength between the dispersion and the thin film, and FIG. 4 shows a graph of analyzing photoluminescence of the dispersion and the thin film.

In addition, Table 2 shows a size of the quantum dots, an average diameter of quantum dots, an average diameter of the core, an average thickness of the ZnSe shell, an average thickness of the ZnS shell, and a ratio of the mole number of selenium to the mole number of sulfur in the quantum dots.

Example 1 and Example 2: Preparation of InP/ZnSe/ZnS Quantum Dot and Analysis of Characteristics Quantum dots of Example 1 including a ZnSe shell having a thickness of about 2.8 nm, ZnS having a thickness of about 0.3 nm, and entire quantum dots have an average diameter of about 9.5 nm and quantum dots of Example 2 including a ZnSe shell having a thickness of about 3.7 nm, ZnS having a thickness of about 0.3 nm, and entire quantum dots have an average diameter of about 11.3 nm are obtained in accordance with the same procedure as in Comparative Example 1, except that the amounts of zinc precursor and selenium precursor, the reaction time, or a combination thereof are further increased during preparing quantum dots having a InP/ZnSe/ZnS structure.

For quantum dots of Examples 1 and 2, the toluene dispersion and the thin film obtained therefrom as in Comparative Example 1 are formed, and a photoluminescence analysis thereof is performed, and the results are shown in Table 1. Table 2 shows a size of the quantum dots, a thickness of the shell, and a ratio of a mole number of selenium to a mole number of sulfur in quantum dots.

Figure 5:
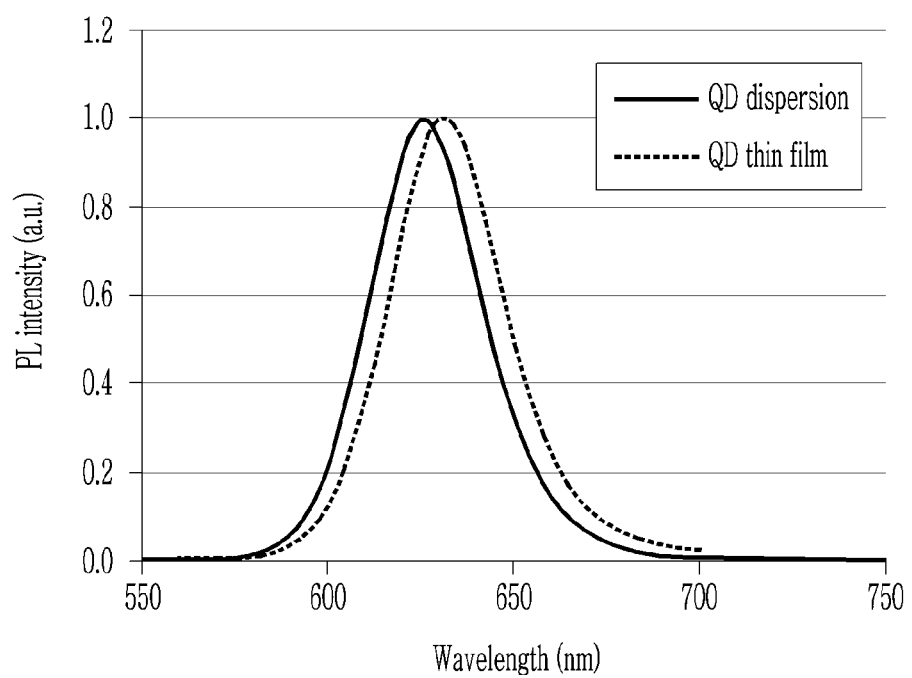
FIG. 5 is a graph of PL (a.u.) versus wavelength (nm) showing luminescence analysis results of the colloidal solution of the quantum dots (QD dispersion) prepared in Example 1 and the thin film prepared therefrom.
Figure 6:
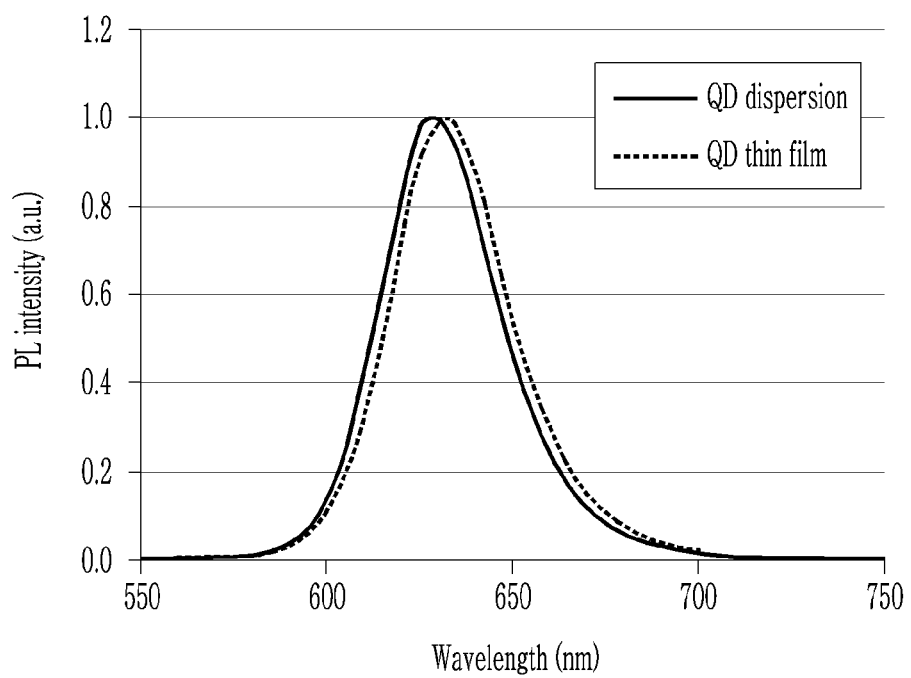
FIG. 6 is a graph of PL (a.u.) versus wavelength (nm) showing luminescence analysis results of the colloidal solution of the quantum dots (QD dispersion) prepared in Example 2 and the thin film prepared therefrom.

In addition, a photoluminescence analysis graph for the quantum dot dispersion and the thin film of Example 1 is also shown in FIG. 5, and a photoluminescence analysis graph for the quantum dot dispersion and the thin film of Example 2 is also shown in FIG. 6.

TABLE 1

|  | Comparative Example 1 | Example 1 | Example 2 |
| --- | --- | --- | --- |
| Solution PL (nm) | 631 | 626 | 629 |
| Solution FWHM (nm) | 36 | 35 | 37 |
| Solution QY (%) | 98 | 94 | 99 |
| Film PL (nm) | 639 | 629 | 631 |
| Film FWHM (nm) | 38 | 36 | 37 |
| Film QY (%) | 69 | 84 | 93 |
| ΔPL (nm) | 8 | 3 | 2 |

ΔPL = Film PL - Solution PL

TABLE 2

|  | Comparative Example 1 | Example 1 | Example 2 |
| --- | --- | --- | --- |
| InP size (nm) | 3.3 | 3.3 | 3.3 |
| ZnSe thickness (nm) | 1.9 | 2.8 | 3.7 |
| ZnS thickness (nm) | 0.3 | 0.3 | 0.3 |
| Se:S ratio | 2.82:1 | 4.6:1 | 5.2:1 |
| QD size (nm) | 7.7 | 9.5 | 11.3 |

Experimental Example: Production of Electroluminescent Device

An electroluminescent device is produced using quantum dots obtained from Comparative Example 1 and Examples 1 and 2 as follows: poly(3,4-ethylenedioxythiophene):poly (styrenesulfonate) (PE DOT: PSS) and poly(9,9-dioctyl-fluorene-co-N-(4-butylphenyl)-diphenylamine) (TFB) layers are formed on glass substrates deposited with indium tin oxide (ITO) electrode (anode) by a spin coating as a hole injection layer (HIL) (about 30 nm) and a hole transport layer (HTL) (about 25 nm), respectively. An octane dispersion of quantum dots are spin-coated on the formed TFB layer to provide a quantum dot light emitting layer (about 25 nm). A zinc oxide nanoparticle-based layer (thickness: about 40 nm) is formed on the quantum dot light emitting layer as an electron transport layer (ETL), and an Al (aluminum) electrode is deposited on the layer.

Figure 7:
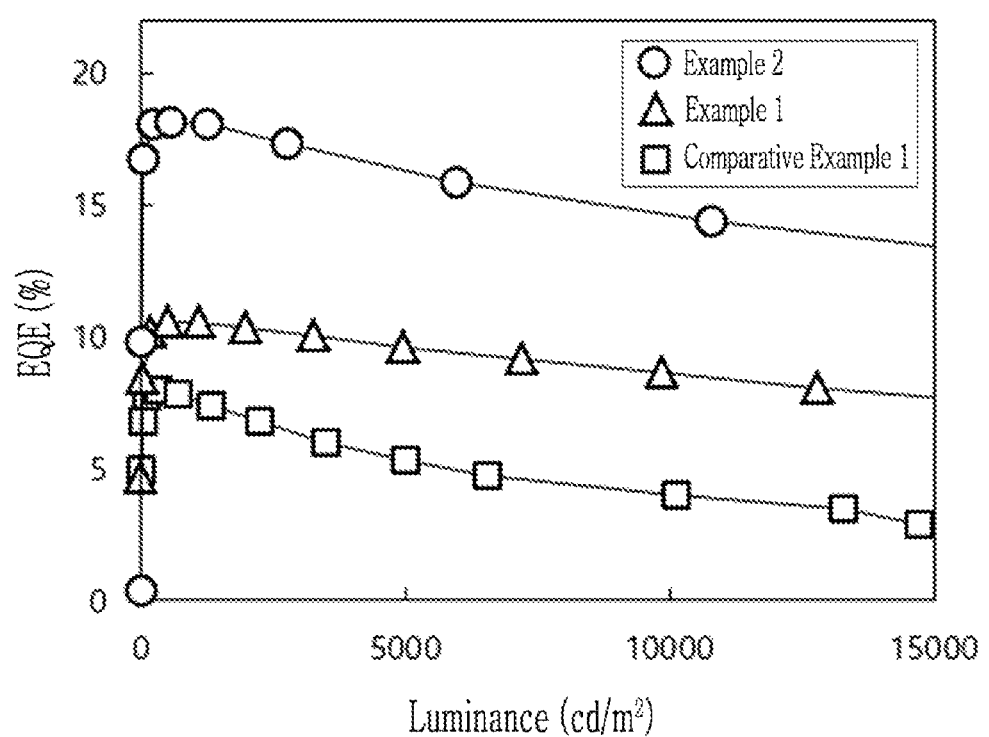
FIG. 7 is a graph of external quantum efficiency (EQE) (percent (%)) versus luminance (candelas per square meter ($cd/m^2$)) showing light conversion rates (%) for a current of the electroluminescent devices including the quantum dots in a light emitting layer of Comparative Example 1 and Example 1, and Example 2.
Figure 8:
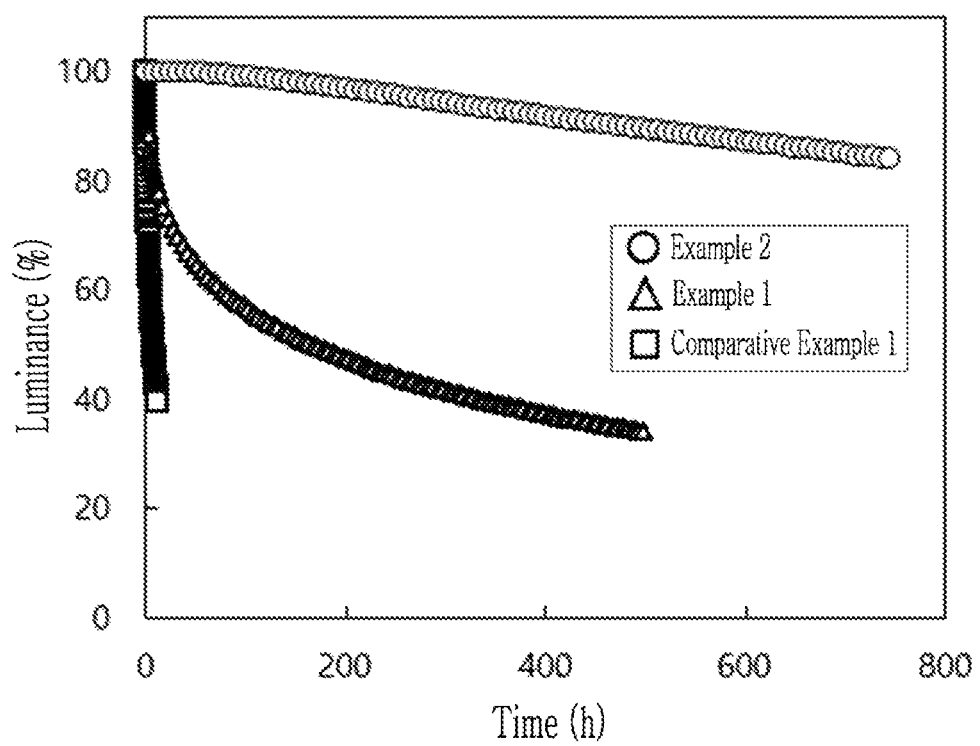
FIG. 8 is a graph of luminance (%) versus time (hours (h)) showing lifetime characteristics of the electroluminescent devices including quantum dots of Comparative Example 1 and Example 1, and Example 2.

The electroluminescent properties and lifetime characteristics of the obtained devices are measured, and the results are shown in Table 3 and FIGS. 7 and 8, respectively.

TABLE 3

|  | Maximum external quantum efficiency (EQE) (%) | Maximum Brightness (candelas per square meter (cd/m²)) | Lifetime, T90 (h) |
| --- | --- | --- | --- |
| Comparative Example 1 | 8.0 | 16,122 | 0.55 |
| Example 1 | 10.6 | 20,353 | 2.3 |
| Example 2 | 18.1 | 60,911 | 480 |

As shown in Table 3 and FIGS. 7 and 8, it is understood that that devices including quantum dots of Examples 1 and 2 having a difference of peak emission wavelength between the quantum dot dispersion and the thin film of less than or equal to 5 nm have significantly high, e.g., desirable, electroluminescence properties, for example, a desirable light conversion rate to current (Maximum EQE (%)), and desirable lifetime characteristics. For example, it is confirmed that the device including quantum dots of Example 2 having a difference of peak emission wavelength between the quantum dot dispersion and the thin film of 2 nm has improved electroluminescence properties and lifetime characteristics compared to the device including quantum dots of Example 1 having a difference of peak emission wavelength 3 nm.

Accordingly, in quantum dots including a core including Group III-V semiconductor nanocrystals and a shell formed on the core, the quantum dots having a smaller difference between emission wavelength of the quantum dot dispersion and the thin film may significantly improve electroluminescence properties and lifetime characteristics of the electronic device including the same, which is accomplished by increasing a thickness of an intermediate layer of the shell except for the outermost layer in the shell formed on the core in the quantum dots.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot comprising
a core comprising a first semiconductor nanocrystal comprising a Group III-V compound, and
a shell disposed on the core, the shell comprising a semiconductor nanocrystal comprising a Group II-VI compound,
wherein the quantum dot does not comprise cadmium, the shell comprises
   a first layer disposed directly on the core, the first layer comprising a second semiconductor nanocrystal comprising zinc and selenium,
   a second layer, the second layer being an outermost layer of the shell, the second layer comprising a third semiconductor nanocrystal comprising zinc and sulfur and
   a third layer disposed between the first layer and the second layer, the third layer comprising a fourth semiconductor nanocrystal comprising zinc, selenium, and optionally sulfur, and
a difference between a peak emission wavelength of a colloidal solution of the quantum dot and a peak emission wavelength of a film prepared from the colloidal solution is less than or equal to about 5 nanometers.

2. The quantum dot of claim 1, wherein a difference between a maximum peak emission wavelength of a colloidal solution of the quantum dot and a maximum peak emission wavelength of a film prepared from the colloidal solution is less than or equal to about 4 nanometers.

3. The quantum dot of claim 1, wherein a diameter of the quantum dot is greater than or equal to about 9 nanometers and a ratio of a mole number of selenium to a mole number of sulfur in the quantum dot is greater than or equal to about 4.5:1.

4. The quantum dot of claim 1, wherein a sum of a thickness of the first layer of the shell and a thickness of the third layer of the shell is greater than or equal to about 2.5 nanometers.

5. The quantum dot of claim 1, wherein a diameter of the quantum dot is greater than or equal to about 9.5 nanometers, and a ratio of a mole number of selenium to a mole number of sulfur in the quantum dot is greater than or equal to about 4.6.

6. The quantum dot of claim 1, wherein a sum of a thickness of the first layer of the shell and a thickness of the third layer of the shell is greater than or equal to about 2.8 nanometers.

7. The quantum dot of claim 1, wherein the fourth semiconductor nanocrystal further comprises sulfur.

8. The quantum dot of claim 1, wherein the third semiconductor nanocrystal consists of zinc and sulfur.

9. The quantum dot of claim 8, wherein a thickness of the second layer is less than about 0.5 nanometers.

10. The quantum dot of claim 1, wherein a thickness of the second layer is less than about 1 nanometer.

11. The quantum dot of claim 1, wherein the first semiconductor nanocrystal comprises indium and phosphorus.

12. The quantum dot of claim 11, wherein the first semiconductor nanocrystal further comprises zinc.

13. The quantum dot of claim 1, wherein a diameter of the core of the quantum dot is about 2.5 nanometers to about 4 nanometers.

14. The quantum dot of claim 1, wherein a diameter of the core of the quantum dot is about 3 nanometers to about 3.5 nanometers.

15. The quantum dot of claim 1, wherein the quantum dot has a peak emission wavelength between 600 nanometers and about 670 nanometers and emit red light.

16. The quantum dot of claim 1, wherein a full width at half maximum of an emission peak of the quantum dot is less than or equal to about 50 nanometers.

17. The quantum dot of claim 1, wherein a quantum efficiency of the colloidal solution of the quantum dot is greater than or equal to about 90% and a quantum efficiency of the film prepared from the solution is greater than or equal to about 80%.

18. An electronic device, comprising
a first electrode and a second electrode facing each other; and
a quantum dot light emitting layer disposed between the first electrode and the second electrode, the quantum dot light emitting layer comprising the quantum dot of claim 1.

19. The electronic device of claim 18, wherein the electronic device comprises a charge auxiliary layer between the first electrode and the quantum dot light emitting layer, between the second electrode and the quantum dot light emitting layer, or a combination thereof.

20. The electronic device of claim 18, wherein
the first electrode comprises an anode,
a hole injection layer, a hole transport layer, an electron blocking layer, or a combination thereof is disposed between the first electrode and the quantum dot light emitting layer,
the second electrode comprises a cathode, and
an electron injection layer, an electron transport layer, a hole blocking layer, or a combination thereof is disposed between the second electrode and the quantum dot light emitting layer.

* * * * *